United States Patent
Schutten et al.

(10) Patent No.: US 10,404,186 B2
(45) Date of Patent: Sep. 3, 2019

(54) POWER MODULE SYSTEMS AND METHODS HAVING REDUCED COMMON MODE CAPACITIVE CURRENTS AND REDUCED ELECTROMAGNETIC INTERFERENCE

(71) Applicant: General Electric Company, Schenectady, NY (US)

(72) Inventors: Michael Joseph Schutten, Rotterdam, NY (US); Fengfeng Tao, Clifton Park, NY (US); Maja Harfman-Todorovic, Niskayuna, NY (US); Ravisekhar Nadimpalli Raju, Clifton Park, NY (US); Philip Michael Cioffi, Schaghticoke, NY (US); Ljubisa Dragoljub Stevanovic, Clifton Park, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 278 days.

(21) Appl. No.: 15/336,413

(22) Filed: Oct. 27, 2016

(65) Prior Publication Data

US 2018/0123476 A1    May 3, 2018

(51) Int. Cl.
  *H02M 7/537* (2006.01)
  *H05K 3/30* (2006.01)
  *H05K 3/36* (2006.01)

(52) U.S. Cl.
  CPC .............. *H02M 7/537* (2013.01); *H05K 3/30* (2013.01); *H05K 3/36* (2013.01)

(58) Field of Classification Search
  CPC .......... H02M 7/537; H02M 1/32; H05K 3/30; H05K 3/36; H02H 9/02; H02H 3/20; H02H 1/04
  See application file for complete search history.

(56) References Cited

U.S. PATENT DOCUMENTS

| | | | |
|---|---|---|---|
| 6,297,551 B1 | 10/2001 | Dudderar et al. | |
| 6,987,670 B2 | 1/2006 | Ahmed et al. | |
| 7,719,092 B2 | 5/2010 | Takubo | |
| 8,472,196 B2 | 6/2013 | Zeng et al. | |
| 8,487,416 B2 | 7/2013 | Delgado et al. | |
| 8,921,998 B2 | 12/2014 | Zushi et al. | |
| 9,209,176 B2 | 12/2015 | Wu et al. | |
| 2006/0082357 A1* | 4/2006 | Tsukamoto | ............ G01R 15/20 324/126 |

(Continued)

*Primary Examiner* — Jue Zhang
*Assistant Examiner* — Lakaisha Jackson
(74) *Attorney, Agent, or Firm* — Fletcher Yoder, P.C.

(57) ABSTRACT

A power module includes an input bus, a switching device, and an output bus. The input bus includes a first coating of a high permeability magnetic conductive material and is configured to receive input direct current (DC) electrical power from an electrical power source. The switching device is electrically coupled to the first input bus, and is configured to selectively connect and disconnect to facilitate converting the input DC electrical power into output alternating current (AC) electrical power. The output bus includes a second coating of the high permeability magnetic conductive material, and is electrically coupled to the first switching device. The output bus is configured to supply the output AC electrical power to an electrical load.

20 Claims, 7 Drawing Sheets

(56) References Cited

U.S. PATENT DOCUMENTS

| | | | |
|---|---|---|---|
| 2008/0303137 A1* | 12/2008 | Ward | H01L 23/3735 257/714 |
| 2010/0065317 A1* | 3/2010 | Okada | C08J 5/24 174/258 |
| 2012/0057388 A1* | 3/2012 | Garrity | H02M 3/338 363/144 |
| 2013/0235628 A1* | 9/2013 | Dong | H02M 7/797 363/47 |

* cited by examiner

POWER MODULE SYSTEMS AND METHODS HAVING REDUCED COMMON MODE CAPACITIVE CURRENTS AND REDUCED ELECTROMAGNETIC INTERFERENCE

BACKGROUND

The present disclosure generally relates to power modules and, more specifically, to reducing electromagnetic interference (EMI) created by power modules.

Power modules may include switching devices (e.g., semiconductor switches and/or transistors) that switch to facilitate converting electrical power, for example, from alternating current (AC) electrical power to direct current (DC) electrical power or vice versa. In some instances, switching the semiconductors may produce high frequency harmonics of differential (e.g., conducted) current. For example, a semiconductor switching at 1 kHz may generate a third harmonic at 3 kHz, a fifth harmonic at 5 kHz, and so on. Additionally, in some instances, the high frequency harmonics may produce common mode currents due to parasitic capacitive coupling paths. These common mode and/or differential mode currents may result in levels of EMI that affect operation of the power module and/or surrounding electrical devices.

BRIEF DESCRIPTION

Certain embodiments commensurate in scope with the original claims are summarized below. These embodiments are not intended to limit the scope of the claims, but rather these embodiments are intended only to provide a brief summary of possible forms of the claimed subject matter. Indeed, the claims may encompass a variety of forms that may be similar to or different from the embodiments set forth below.

In one embodiment, a power module includes an input direct current (DC) power bus, a switching device, and an output alternating current (AC) power bus. The input bus includes a first coating of a high permeability magnetic conductive material and is configured to receive input direct current (DC) electrical power from an electrical power source. The switching device is electrically coupled to the first input bus, and is configured to selectively connect and disconnect to facilitate converting the input DC electrical power into output alternating current (AC) electrical power. The output bus includes a second coating of the high permeability magnetic conductive material, and is electrically coupled to the first switching device. The output bus is configured to supply the output AC electrical power to an electrical load.

In a second embodiment, a power module includes an input terminal, an output terminal, a housing, a switching device, a positive input bus, a negative input bus, a first capacitor, a second capacitor, and a metal flashing. The input terminal is configured to receive input electrical power. The output terminal is configured to output electrical power from the power module. The housing is disposed about the switching device, the positive input bus, the negative input bus, the first capacitor, the second capacitor, and the metal flashing. The switching device is configured to selectively open and close to facilitate converting the input electrical power into the output electrical power. The positive input current bus and the negative input current bus are electrically coupled to the input terminal and the switching device. The first capacitor is electrically coupled, in a low inductance manner, between the positive input bus and the negative input bus inside the module. The second capacitor is electrically coupled, in a low inductance manner, between ground and the positive input current bus or the negative input current bus, inside the module. The metal flashing is disposed on an interior surface of the housing and is electrically coupled to the positive input current bus or the negative input current bus.

In a third embodiment, a method includes coating a positive input bus and a negative input bus with a coating of a high permeability magnetic conductive material, electrically coupling the positive input bus and the negative input bus to a switching device, electrically coupling a positive output bus and a negative output bus to the switching device, and installing a housing about the switching device. The switching device is configured to selectively connect and disconnect to facilitate converting an input direct current (DC) electrical power into output alternating current (AC) electrical power. A metal flashing is disposed between the switching device and the housing to enable the metal flashing to capture electric fields generated during operation of the power model and to direct the induced current to the positive input bus, the negative input bus, or both.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
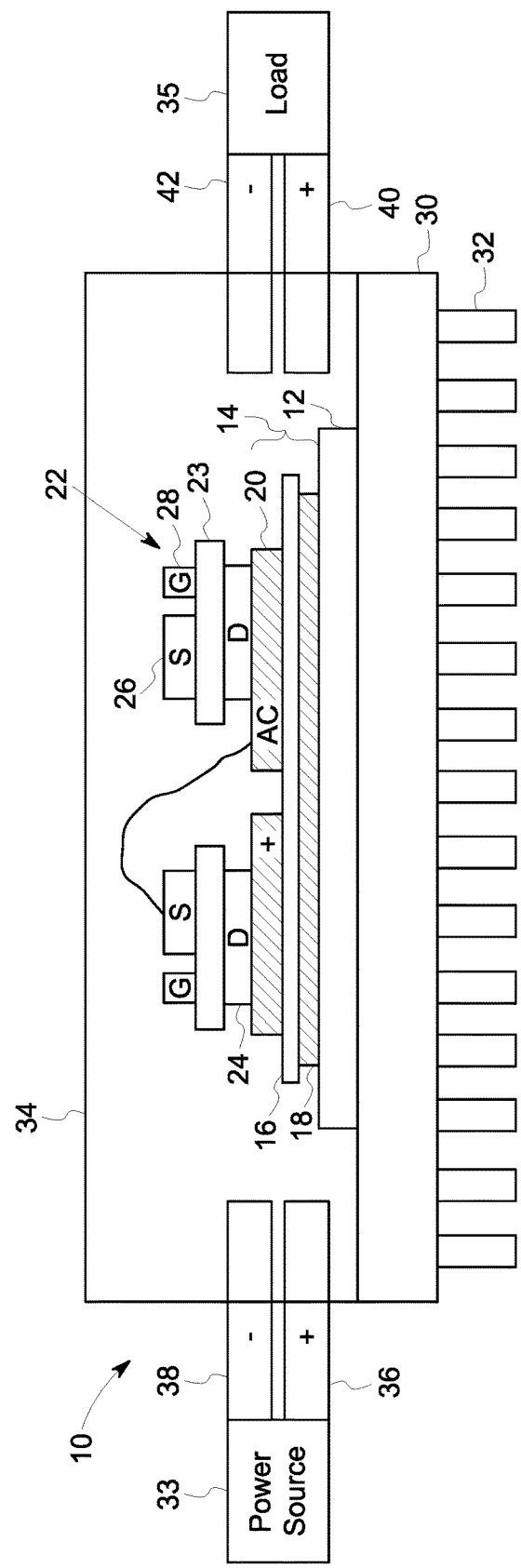
FIG. 1 is a side-section view of a power module package, in accordance with an embodiment.

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

Switching of switching devices in a power module may generate high frequency harmonics of differential (e.g., conducted) current, di/dt. However, the high frequency differential current may result in electromagnetic interference (EMI) issues. Additionally, the high frequency currents may flow in parasitic capacitance paths that produces an electric field, which induces common mode currents (e.g., stray currents through undesired flow paths) in nearby conductors. In some instances, resulting electromagnetic interference (e.g., high frequency differential current and/or induced common mode current) may affect operation of the power module and/or surrounding electrical devices, for example, connected to the nearby conductors.

To facilitate reducing likelihood of EMI affecting operation, the present disclosure provides techniques, which may be used individually or in any suitable combination, to reduce likelihood of high frequency differential current flowing from the power module to another electrical device and/or likelihood of common mode current being induced in another electrical device. In particular, the techniques may facilitate reducing (e.g., redirecting) EMI currents to close back to its source. In some embodiments, these techniques may include adding filtering components in a power module packaging, such as X capacitors, Y capacitors, and/or magnetic cores to filter common mode current and/or differential mode current. Additionally, in some embodiments, the techniques may include adding current redirecting conductors, such as a metal flashing, a metal foil, and/or copper sheet, around or near the switching devices to control flow of common mode current. Furthermore, in some embodiments, the techniques may include coating input and/or output bus terminals with magnetic conductive material (e.g., high permeability nickel). Moreover, in some embodiments, the techniques may include modifying the shape of various components (power semi-conductor die, X capacitor, Y capacitor) in the power module packaging, for example, to be more planar, and thus reduce loop inductances.

In this manner, the techniques may facilitate reducing implementation associated cost used to sufficiently dampen EMI, such as component count, component cost, and/or packaging size. For example, damping EMI close to its source may obviate large form-factor external EMI filters. Additionally, damping EMI close to its source may facilitate sufficiently damping EMI using lower rated and/or smaller form factor filtering components. Also, damping EMI inside the module reduces the ability of EMI currents to flow through numerous other paths, each of which would require EMI damping (e.g. filtering).

To help illustrate, FIG. 1 is a side-section view of a power module 10, such as a silicon carbide power module. As shown, the power module 10 includes a baseplate 12. Additionally, as depicted, a direct bonded copper (DBC) substrate 14 is coupled (e.g., soldered, bonded, etc.) to one (e.g., top) side of the baseplate 12. In some embodiments, the DBC substrate 14 may include a ceramic tile 16 with layers of copper bonded to one or both sides of the ceramic tile 16. For example, in the depicted embodiment, a bottom copper layer 18 is bonded to a bottom side of the ceramic tile 16 and a top copper layer 20 is bonded to a top side of the ceramic tile 16.

In some embodiments, the ceramic tile may be alumina ($Al_2O_3$), aluminum nitride (AlN), beryllium oxide (BeO), or some other ceramic material. Additionally, the bottom copper layer 18 and/or the top copper layer 20 may be made of pure copper, an alloy containing copper, or some other conductive material. Furthermore, in some embodiments, the bottom copper layer 18 and/or the top copper layer 20 may not cover the entire surface of the ceramic tile 16.

One or more switching devices 22 (e.g., an upper switching device and a lower switching device) may be coupled (e.g., soldered) to the DBC substrate 14. The one or more switching devices 22 may be transistors or semiconductor switches, such as silicon carbide switches, silicon carbide transistors, MOSFETs, IGBTs, and/or the like. As shown, a switching device 22 includes a die 23 with, on one side, drain 24 metallization and, on the opposite side, source 26 and gate 28 metallization. In the illustrated embodiment, the drain 24 is solder-attached to the DBC substrate 14, while the source 26 and gate 28 are wire bonded, or connected in another manner (e.g. HDI interconnection).

In some embodiments, a heatsink 30 may be coupled to the baseplate 12 opposite the DBC substrate 14 to aid in cooling the power module 10. In the illustrated embodiment, the heatsink 30 uses fins 32 to increase surface area and, thus, aid cooling. The fins 32 may be straight, pin-shaped, flared, or any other suitable shape. Further, the heatsink 30 may use one or more other heat dissipation techniques to cool the power module 10, such as a fan, fluid, a heat tube, etc. The heatsink 30 and/or the baseplate 12 may be grounded for safety and/or for ground-referenced cooling. The power module 10 may also include a housing (e.g., packaging) 34 that surrounds all of the components except for the heatsink 30.

In operation, the power module 10 may receive an input electrical power from an electrical power source 33 (e.g., a battery, generator, etc.) and output electrical power to a load 35 (e.g., motor, lightbulb, battery). For example, in the illustrated embodiment, the power module 10 may operate the switching devices 22 as a half-bridge converter to convert input DC power received via the external input bus (e.g., positive terminal 36 of the DC input bus and negative terminal 38 of the DC input bus) into AC power output via external an output bus (e.g., positive terminal 40 of the AC output bus and negative terminal 42 of the DC output bus). In other embodiments, the power module 10 may operate to convert input AC power into DC output power, convert input DC power to a different DC output power (e.g., adjust voltage and/or current), and/or or convert input AC power to a different AC output power. Accordingly, the input bus and the output bus may be configured for various combinations of AC and DC power as needed.

In some embodiments, the power module may include input terminals that electrically couple the external input bus to internal input bus. Additionally, the power module may include output terminals that electrically couple internal output bus to the external input bus. In particular, the input terminals and/or the output terminals may be external the housing 34 while the internal input bus and/or the internal input bus may be within the housing 34 and electrically coupled to the switching devices 22.

To facilitate converting input electrical power into output electrical power, the switching devices 22 selectively open (e.g., disconnect) and close (e.g., connect). As such, opening (e.g., disconnecting) and/or closing (e.g., connecting) a switching device 22 may cause changes in current conducted in the power module 10. However, in some embodiments, opening and/or closing a switching device 22 may also cause considerable changes in voltage over time (dv/dt) between the top copper layer 20 and the baseplate 12 and/or between the top copper layer 20 and the heatsink 30.

Even when the switching devices 22 are switched at a relatively low frequency, harmonics may result in high frequency changes in current over time (di/dt) and/or changes in voltage over time (dv/dt). In some instances, high frequency differential current exiting the power module may affect operation of other electrical components (e.g., devices, equipment, or machines) electrically connected to the power module 10, for example, via the input terminals and/or the output terminals). Additionally, in some instances, the change in voltage over time may result currents flowing due to the parasitic capacitance with the top copper layer 20 and/or the baseplate 12. The currents flowing due to the parasitic capacitance may induce stray currents (e.g., common mode currents) through unplanned (e.g., unintended or undesired) paths, thereby resulting in electromagnetic interference that may affect operation of the power module 10 and/or surrounding electrical components (e.g., devices, equipment, or machines). A number of techniques, discussed in more detail below, may be used individually or in combination to facilitate improving the EMI performance of the power module 10.

Figure 2:
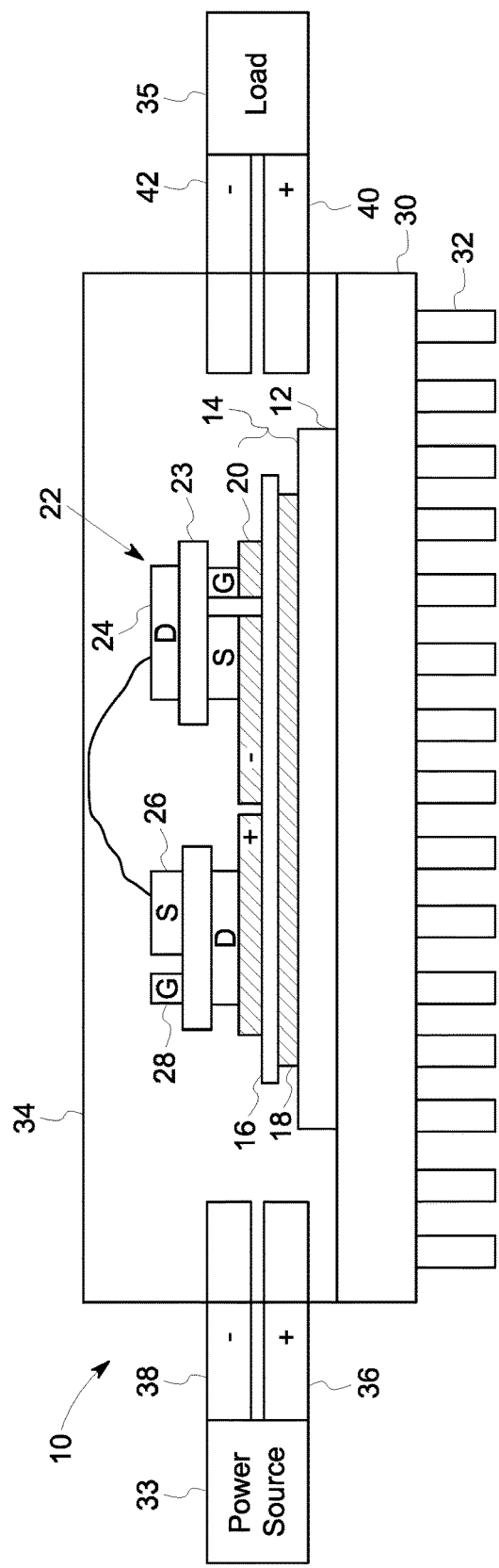
FIG. 2 is a side-section view of a power module package with a lower switching device flipped, in accordance with an embodiment.

For example, FIG. 2 is a side-section view of the power module package of FIG. 1, but with the lower switching device 22 flipped, such that the source 26 and gate 28 are soldered to the DBC substrate 14 and the drain 24 faces away from the DBC substrate 14. As shown, rather than being connected to the AC node, which has considerable dv/dt, the source 26 is connected to the lower dv/dt "-" node. In this configuration, less common mode related current will run through the baseplate 12. Instead, the capacitive currents associated with the AC node will be bypassed to the local DC link.

Figure 3:
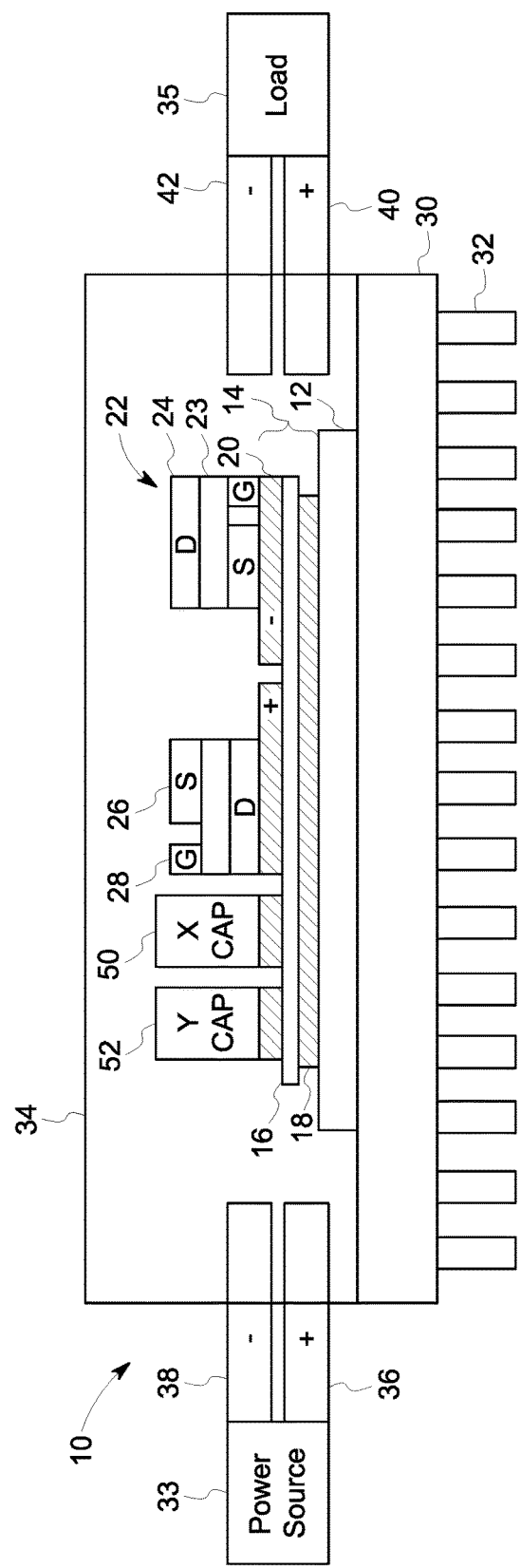
FIG. 3 is a side-section view of the power module package of FIG. 2 having an X capacitor and a Y capacitor, in accordance with an embodiment.

Additionally, FIG. 3 illustrates using an X capacitor 50 and a Y capacitor 52 in the housing 34 of the power module 10 to reduce EMI. The X capacitor 50 may be connected across the internal DC bus to provide a low impedance path for AC current between the positive DC input bus terminal 36 and the negative DC input bus terminal 38. Specifically, the X capacitor 50 may be connected to the positive DC input bus terminal 36 and the negative DC input bus terminal 38, for example, via internal input bus and/or input terminals. Additionally, the Y capacitor 52 may be connected between the positive DC input bus terminal 36 of the DC link and ground (e.g., the baseplate 12), between the negative DC input bus terminal 38 of the DC link and ground (e.g., the baseplate 12), or both, for example, via internal output bus and/or output terminals. By locating the X capacitor 50 and the Y capacitor 52 within the housing 34, and thus closer to the sources of the EMI (e.g., switching devices 22) filtering efficiency may be improved.

In particular, locating the X capacitor 50 and/or the Y capacitor 52 within packaging (e.g., housing 34) of the power module 10 may be more effective at reducing EMI compared to external (e.g., outside the housing 34) filtering capacitors. For example, locating the X capacitor 50 and/or the Y capacitor 52 internally may reduce loop inductance to 1-2 nH to sufficiently dampen EMI compared to 20 nH loop inductance when using filtering capacitors outside the module. By providing a lower inductance path for conducted electrical power, the X capacitor 50 and/or the Y capacitor 52 may facilitate reducing the magnitude and/or likelihood of common mode current induced in surrounding electrical components. Additionally, by reducing inductance between the switching devices 22 and the capacitors (e.g., X capacitor 50 and/or the Y capacitor 52), the likelihood of high frequency current flowing and/or staying within the power module 10 is improved. In this manner, magnitude of the high frequency currents flowing outside of the power module 10 and affect operation of other electrical devices may be reduced.

In addition to adding X and Y capacitors 50, 52, using components within the power module package (e.g., the X and Y capacitors 50, 52 and the semiconductor die 23) that are more planar in shape, rather than tubular, may further reduce inductance between the semiconductor die and the capacitors. This is because planar structures allow lower inductance interconnections than comparable tubular wire shaped members. In this manner, modifying structure of components to be more planar may facilitate further reducing the inductance between the die 23 and the capacitors (e.g., X capacitor 50 and/or the Y capacitor 52), thereby facilitate further reducing in EMI.

Figure 4:
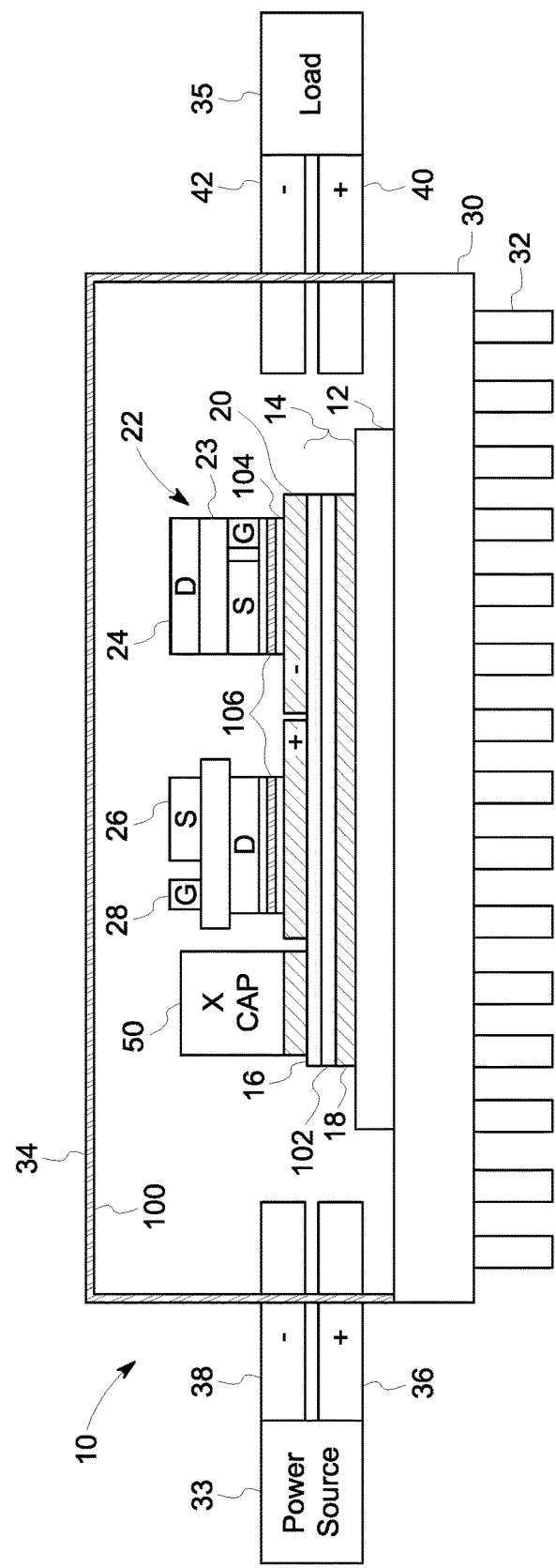
FIG. 4 is a side-section view of the power module package of FIG. 2 having additional features to facilitate reducing EMI, in accordance with an embodiment; Note, in FIG. 4, also show the metal flashing going vertically along the side of the module, also include a X capacitor in FIG. 4 drawing

FIG. 4 illustrates additional features that may improve EMI performance of the power module 10. For example, in the illustrated embodiment, the power module 10 includes a metal flashing 100 (e.g., copper flashing) disposed on an inside surface of the housing 34 above and to the sides of the switching devices 22. In some embodiments, the metal flashing 100 may be disposed on the internal surface of the housing 34 before the housing 34 is installed over the power module 10. In some embodiments, the metal flashing 100 may be coupled to the negative DC input bus terminal 38 or the positive DC input bus terminal 36, for example, via the internal input bus and/or the input terminals. In this configuration, the metal flashing 100 may reduce the likelihood of generated electric fields exiting the power module 10 and, instead, redirect the induced currents to preferred paths inside the module (e.g. through the internal X capacitors). In other embodiments, the metal flashing 100 may be connected to the heat sink 30, the baseplate 12, or to the bottom copper layer 18.

The embodiment shown in FIG. 4 also includes a metal foil 102 inside the DBC substrate 14. Similar to the metal flashing 100, the metal foil 102 may capture generated electric fields, thereby reducing likelihood of the generated electric fields exiting the power module 10. In some embodiments, the metal foil 102 may be copper or any other conductive material. This added electrical foil will be electrically connected inside of the module.

Another technique to facilitate improving EMI performance of a power module 10 includes mounting an electrical circuit board 104 between the DBC substrate 14 and the switching devices 22. That is, the electrical circuit board 104 may be coupled to the DBC substrate 14 and the switching devices 22 may be coupled to the electrical circuit board 104. In some embodiments, the electrical circuit board 104 may include a copper plane 106 connected to the negative input terminal 38, for example, via the internal input bus and/or the input terminals. Additionally, in some embodiments, the copper plane 106 may be made copper, a copper alloy, or some other conductive material.

The metal flashing 100, the metal foil 102 in the DBC substrate 14, and/or the copper plane 106, when used in a power module 10 may act to redirect induced common mode current to keep them from escaping (e.g., exiting) the power module 10. It should be understood that, although the embodiment of the power module package 10 shown in FIG. 4 includes the metal flashing 100, the metal foil 102 inside the DBC substrate 14, and the electrical circuit board 104 with the floating copper plane 106, this is merely for illustrative purposes. The power module 10 may include any combination of the disclosed techniques, not just the combination shown in FIGS. 1-4.

In some embodiments, an external bus (e.g., external input bus terminal 36 or 38 and/or an external output bus terminal 40 or 42) may be coated with a magnetic conductive material (e.g., high permeability nickel). Such a coating may result in low resistance for low frequency currents, but high resistance for high frequency currents. For example, the magnetic conductive material coating may facilitate flow of low frequency differential mode current while impeding high frequency differential mode current. In this manner, such a coating may facilitate supply of electrical power at a target frequency, but impede EMI (e.g., high frequency differential-mode or common-mode currents) from leaving the power module 10. In some embodiments, this coating may be applied on the positive DC input bus terminal 36, the negative DC input bus terminal 38, and/or the AC output bus. In fact, coating the input/output bus with the magnetic conductive material coating may also facilitate improving effectiveness of other internal filtering techniques.

Figure 5:
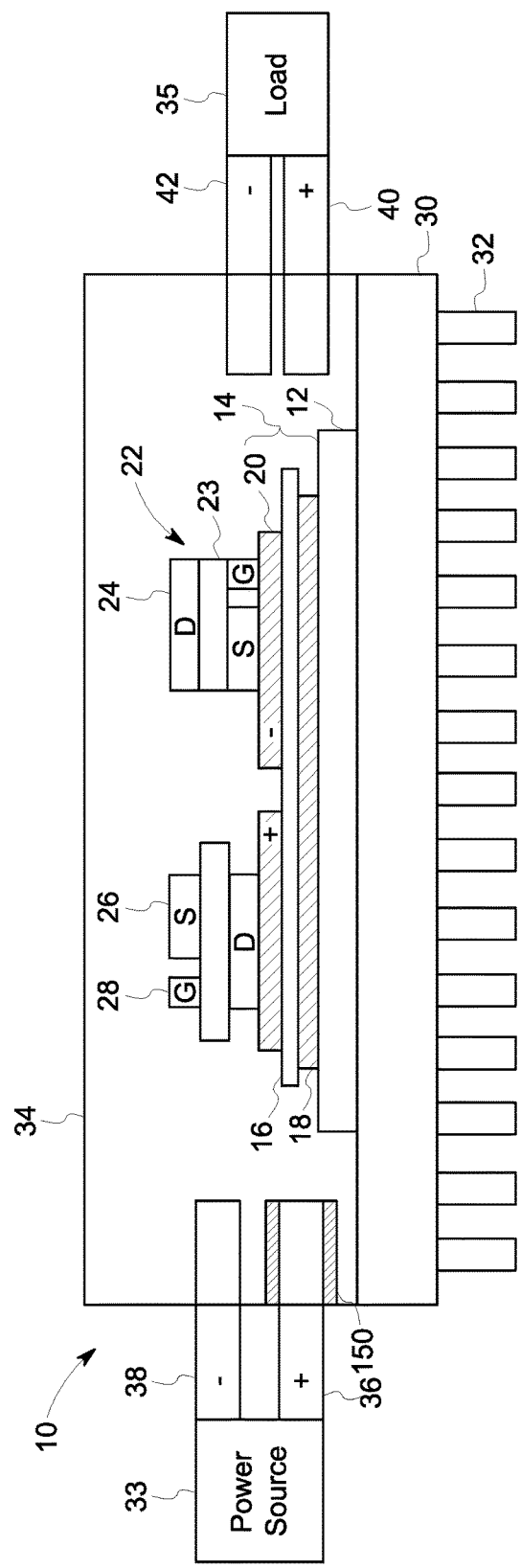
FIG. 5 is a side-section view of the power module of FIG. 2 with a magnetic component around one of the DC input bus terminals, in accordance with an embodiment.
Figure 6:
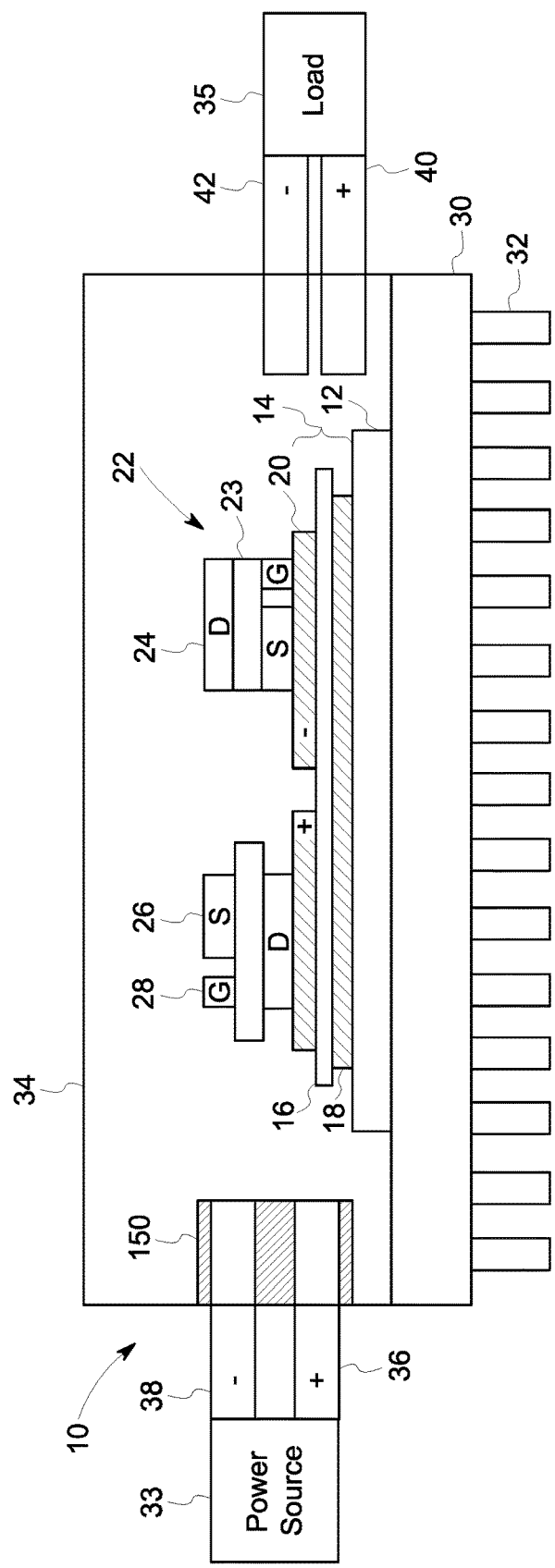
FIG. 6 is a side-section view of the power module of FIG. 2 with the magnetic component around both DC input bus terminals, in accordance with an embodiment.
Figure 7:
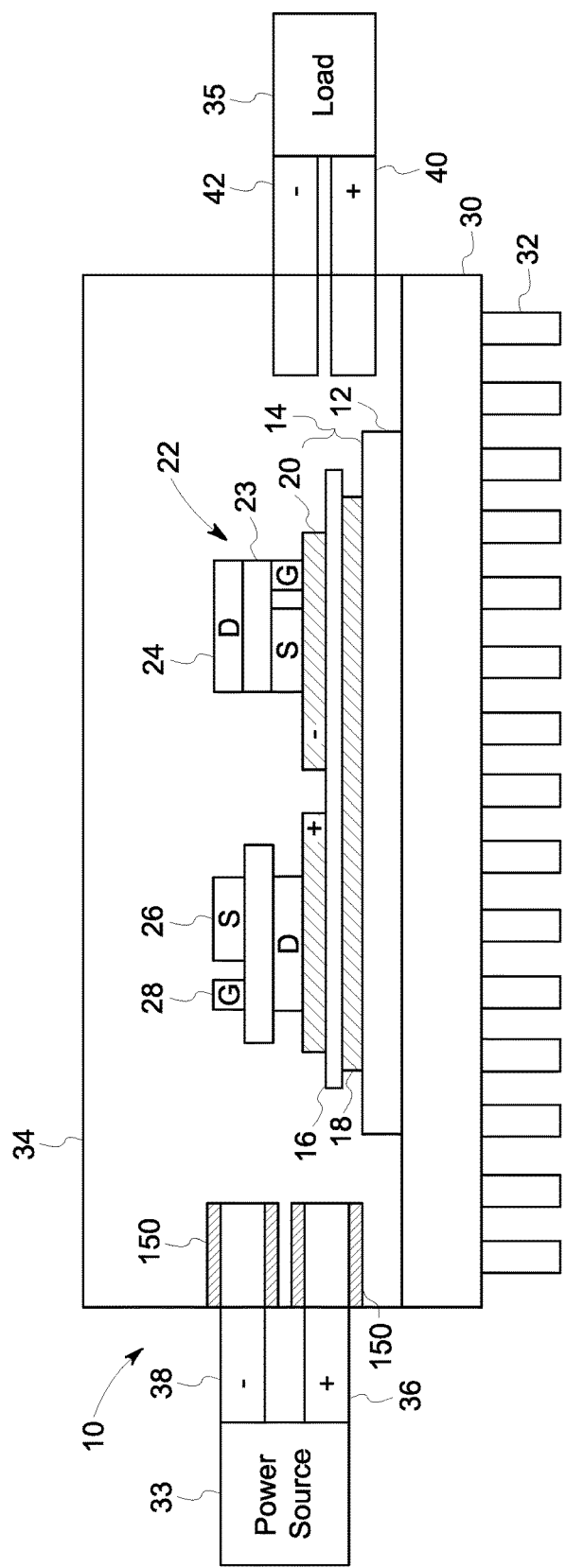
FIG. 7 is a side-section view of the power module of FIG. 2 with separate magnetic cores around each of the DC input bus terminals, in accordance with an embodiment.

FIGS. 5-7 illustrate various techniques for improving EMI performance of the power module 10 using magnetic material. In particular, FIG. 5 shows the power module 10 with a magnetic core 150 disposed around (e.g., about) the positive DC input bus terminal 36. In this manner, the magnetic core 150 act as a differential mode filter by reducing likelihood of high frequency currents exiting the power module 10. Though the magnetic core 150 is shown around the positive DC input bus terminal 36, it should be understood that the magnetic core 150 may additionally or alternatively be disposed about the negative DC input bus terminal 38.

Additionally, FIG. 6 shows the power module 10 with the magnetic core 150 disposed around both the positive DC input bus terminal 36 and the negative DC input bus terminal 38. In this manner, the magnetic core 150 acts as common mode filter, reducing the ability of common-mode currents from exiting the module and flowing in unintentional paths, and thus redirecting those currents inside the module through the intentional paths. In the illustrated embodiment, the positive DC input bus terminal 36 and the negative DC input bus terminal 38 have a single magnetic core 150 around them, but it should be understood that both of the output bus may also have a magnetic core 150 disposed around it (see, e.g., FIG. 7). In other embodiments, common mode filtering may be achieved by common mode inductors and/or common mode capacitors. The common mode inductor may be either a two-wire common mode inductor, for the positive DC input bus terminal 36 and the negative DC input bus terminal 38, or a three-wire common mode inductor about the positive DC input bus terminal 36, negative DC input bus terminal 38, and the AC output bus.

Furthermore, FIG. 7 is a side-section view of the power module 10 with separate magnetic cores 150 around each of the positive DC input bus terminal 36 and the negative DC input bus terminal 38. In the illustrated embodiment, the positive DC input bus terminal 36 and the negative DC input bus terminal 38 each have a magnetic core 150, but it should be understood that the AC output bus may also have magnetic cores 150 disposed around each. The illustrated embodiment, having individual magnetic cores around the positive DC input bus terminal 36 and the negative DC input bus terminal 38 may facilitate both common mode filtering and differential mode filtering. In some embodiments, the magnetic cores 150 are ferrite, but in other embodiments, the magnetic cores 150 may be made of other magnetic materials (e.g. finemet or an amorphous magnetic material). Additionally, in other embodiments, common mode filtering may be achieved by common mode inductors and/or common mode capacitors. The common mode inductor may be either a two-wire common mode inductor, for the positive DC input bus terminal 36 and the negative DC input bus terminal 38, or a three-wire common mode inductor about the positive DC input bus terminal 36, negative DC input bus terminal 38, and the AC output switching node.

Accordingly, the technical effects of the present disclosure include reducing likelihood of electromagnetic interference resulting from operation of a power module affecting operation of the power module and/or surrounding electrical devices. In some embodiments, these techniques may include adding filtering components, such as X capacitors, Y capacitors, and/or magnetic cores, closer to the source of EMI, for example, within a housing (e.g., packaging) of the power module. Additionally, in some embodiments, the techniques may include adding conductors, such as a metal flashing, a metal foil, and/or copper sheet, around or near the switching devices, for example, within a housing (e.g., packaging) of the power module to reduce likelihood of electric fields and/or inducted common mode current exiting the power module. Furthermore, in some embodiments, the techniques may include coating input and/or output bus with magnetic conductive material (e.g., high permeability nickel). Moreover, in some embodiments, the techniques may include modifying the shape of various components (power semi-conductor die, X capacitor, Y capacitor) in the power module packaging, for example, to be more planar.

This written description uses examples to disclose the claimed subject matter, including the best mode, and also to enable any person skilled in the art to practice the disclosed subject matter, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power module, comprising:
   a first input bus configured to receive input direct current (DC) electrical power from an electrical power source, wherein the first input bus comprises a first coating of a high permeability magnetic conductive material;
   a first switching device electrically coupled to the first input bus, wherein the first switching device is configured to selectively connect and disconnect to facilitate converting the input DC electrical power into output alternating current (AC) electrical power; and
   a first output bus electrically coupled to the first switching device, wherein the first output bus is configured to supply the output AC electrical power to an electrical load and the first output bus comprises a second coating of the high permeability magnetic conductive material.

2. The power module of claim 1, comprising a direct bonded copper (DBC) substrate, wherein the DBC substrate comprises:
a ceramic tile;
a copper layer disposed on a first side of the ceramic tile, wherein the copper layer is configured to electrically couple the first switching device to the first input bus or the first output bus; and
a foil layer disposed on a second side of the ceramic tile, wherein the foil layer is configured to capture an electric field generated by selectively connecting and disconnecting the first switching device.

3. The power module of claim 2, comprising a second switching device, wherein a source and a gate of the second switching device face the DBC substrate, and a drain of the second switching device faces away from the DBC substrate.

4. The power module of claim 1, comprising a circuit board coupled to the first switching device, wherein the circuit board comprises a copper plane electrically connected to the first input bus, wherein:
the first switching device is configured to generate an electric field when converting the input DC electrical power into the output AC electrical power that induces a current in the copper plane; and
the copper plane is configured to direct the current to the first input bus.

5. The power module of claim 1, comprising a first magnetic element disposed about the first input bus.

6. The power module of claim 1, comprising:
a housing disposed about the first switching device; and
a copper layer disposed between the housing and the first switching device.

7. The power module of claim 1, wherein the first and second coatings of the high permeability conductive material are configured to provide a high resistance to high frequency currents and a low resistance to low frequency currents.

8. The power module of claim 1, wherein the first switching device comprises a silicon carbide semiconductor.

9. A power module, comprising:
an input terminal configured to receive an input electrical power;
an output terminal configured to output an output electrical power from the power module; and
a housing disposed about:
a switching device configured to selectively open and close to facilitate converting the input electrical power into the output electrical power;
a positive input bus terminal and a negative input bus terminal that electrically couples the input terminal to the switching device through the housing;
a first capacitor electrically coupled between the positive input bus terminal and the negative input bus terminal;
a second capacitor electrically coupled between ground and the positive input bus terminal or the negative input bus terminal; and
a metal flashing disposed on an interior surface of the housing and electrically coupled to the positive input bus terminal or the negative input bus terminal.

10. The power module of claim 9, wherein:
the input terminal is configured to receive direct current (DC) electrical power; and
the output terminal is configured to supply alternating current (AC) electrical power.

11. The power module of claim 9, wherein:
the switching device is configured to generate an electric field when selectively opening and closing; and
the metal flashing is configured to direct a current induced in the metal flashing by the electric field to the positive input current bus terminal or the negative input current bus terminal.

12. The power module of claim 9, comprising a direct bonded copper (DBC) substrate, wherein the DBC substrate comprises:
a ceramic tile;
a copper layer disposed on a first side of the ceramic tile, wherein the copper layer is configured to electrically couple the switching device to the positive input bus terminal, the negative input bus terminal, an output bus terminal, or any combination thereof;
a foil layer disposed on a second side of the ceramic tile, wherein the foil layer is configured to capture an electric field generated by selectively connecting and disconnecting the switching device.

13. The power module of claim 9, comprising a circuit board disposed between the DBC and the switching device, wherein the circuit board comprises an additional copper foil configured to capture an electric field generated by selectively connecting and disconnecting the switching device.

14. The power module of claim 9 wherein the power module comprises:
a DC to AC converter; and
an output bus terminal that electrically couples the switching device to the output terminal through the housing.

15. The power module of claim 9, comprising a first magnetic element disposed about the positive input current bus terminal or the negative input current bus terminal.

16. The power module of claim 9, wherein the positive input current bus terminal and the negative input current bus terminal comprise coatings of a high permeability magnetic conductive material, configured to have a high resistance for high frequency currents and a low resistance for low frequency currents.

17. A method, comprising:
coating a positive input bus terminal and a negative input bus terminal of a power model with a high permeability magnetic conductive material;
electrically coupling the positive input bus terminal and the negative input bus terminal to a switching device in the power module to enable the switching device to selectively connect and disconnect to facilitate converting direct current (DC) electrical power into alternating current (AC) electrical power;
electrically coupling a positive output bus terminal and a negative output bus terminal to the first switching device; and
installing a housing about the switching device, wherein a metal flashing is disposed between the switching device and the housing to enable the metal flashing to capture an electric field generated during operation of the power model and to direct an induced current to the positive input bus terminal, the negative input bus terminal, or both.

18. The method of claim 17, comprising coupling a direct bonded copper (DBC) substrate to the switching device, wherein the DBC substrate comprises:
a ceramic tile;
a copper layer disposed on a first side of the ceramic tile, wherein the copper layer is configured to electrically couple the first switching device to the positive input bus, the negative input bus terminal, the positive output bus terminal, or the negative output bus terminal; and a foil layer disposed on a second side of the ceramic tile, wherein the foil layer is configured to capture the electric field generated by selectively connecting and disconnecting the first switching device.

19. The method of claim 17, comprising coupling a circuit board to the first switching device, wherein:

the circuit board comprises an additional copper plane electrically connected to the positive input bus terminal, the negative input bus terminal, or both;

the first switching device is configured to generate an electric field when converting the input DC current into the output AC current that induces a current in the additional copper plane; and the additional copper plane is configured to direct the current to the positive input bus terminal, the negative input bus terminal, or both.

20. The method of claim 17, comprising disposing a magnetic element about the positive input bus terminal, the negative input bus terminal, or both.

* * * * *